(12) United States Patent
Cok et al.

(10) Patent No.: US 10,380,930 B2
(45) Date of Patent: Aug. 13, 2019

(54) HETEROGENEOUS LIGHT EMITTER DISPLAY SYSTEM

(71) Applicant: X-Celeprint Limited, Cork (IE)

(72) Inventors: Ronald S. Cok, Rochester, NY (US);
Christopher Bower, Raleigh, NC (US);
Matthew Meitl, Durham, NC (US)

(73) Assignee: X-Celeprint Limited, Cork (IE)

( * ) Notice: Subject to any disclaimer, the term of this patent is extended or adjusted under 35 U.S.C. 154(b) by 676 days.

(21) Appl. No.: 14/834,042

(22) Filed: Aug. 24, 2015

(65) Prior Publication Data
US 2017/0061842 A1  Mar. 2, 2017

(51) Int. Cl.
| G09G 5/02 | (2006.01) |
|---|---|
| G09G 3/20 | (2006.01) |
| G09G 3/3208 | (2016.01) |
| H01L 27/32 | (2006.01) |

(52) U.S. Cl.
CPC ......... *G09G 3/2003* (2013.01); *G09G 3/3208* (2013.01); *H01L 27/3211* (2013.01); *G09G 2300/0443* (2013.01); *G09G 2300/0452* (2013.01); *G09G 2320/0242* (2013.01); *G09G 2320/0666* (2013.01); *H01L 27/3213* (2013.01)

(58) Field of Classification Search
None
See application file for complete search history.

(56) References Cited

U.S. PATENT DOCUMENTS

| 4,746,202 A | 5/1988 | Perilloux et al. |
|---|---|---|
| 5,060,027 A | 10/1991 | Hart et al. |
| 5,550,066 A | 8/1996 | Tang et al. |
| 5,621,555 A | 4/1997 | Park |
| 5,625,202 A | 4/1997 | Chai |
| 5,748,161 A | 5/1998 | Lebby et al. |

(Continued)

FOREIGN PATENT DOCUMENTS

| CN | 103677427 A | 3/2014 |
|---|---|---|
| EP | 1662301 A1 | 5/2006 |

(Continued)

OTHER PUBLICATIONS

International Search Report, PCT/EP2015/063709, dated Dec. 15, 2015, 6 pages.

(Continued)

*Primary Examiner* — Carl Adams
(74) *Attorney, Agent, or Firm* — William R. Haulbrook; Michael D. Schmitt; Choate, Hall & Stewart LLP

(57) ABSTRACT

A heterogeneous light-emitter display includes a display substrate having a plurality of pixels disposed thereon. Each pixel including at least a first heterogeneous multiple-component sub-pixel emitting a first color of light and a second sub-pixel emitting a second color of light different from the first color. A heterogeneous light-emitter display can also include an array of heterogeneous pixels. Each heterogeneous pixel includes a plurality of first pixels and a plurality of second pixels. The first sub-pixel of each of the first pixels includes a first light emitter and the first sub-pixel of each of the second pixels includes a second light emitter different from the first light emitter. One or more pixel controllers control the pixels, the first and second pixels, the first and second sub-pixels, and the first and second light emitters.

23 Claims, 6 Drawing Sheets

(56) References Cited

U.S. PATENT DOCUMENTS

| | | |
|---|---|---|
| 5,815,303 A | 9/1998 | Berlin |
| 5,886,401 A | 3/1999 | Liu |
| 5,917,572 A | 6/1999 | Kurauchi et al. |
| 5,994,722 A | 11/1999 | Averbeck et al. |
| 6,025,730 A | 2/2000 | Akram et al. |
| 6,084,579 A | 7/2000 | Hirano |
| 6,087,680 A | 7/2000 | Gramann et al. |
| 6,142,358 A | 11/2000 | Cohn et al. |
| 6,143,672 A | 11/2000 | Ngo et al. |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,288,824 B1 | 9/2001 | Kastalsky |
| 6,340,999 B1 | 1/2002 | Masuda et al. |
| 6,392,340 B2 | 5/2002 | Yoneda et al. |
| 6,403,985 B1 | 6/2002 | Fan et al. |
| 6,410,942 B1 | 6/2002 | Thibeault et al. |
| 6,466,281 B1 | 10/2002 | Huang et al. |
| 6,504,180 B1 | 1/2003 | Heremans et al. |
| 6,552,740 B1 | 4/2003 | Wong et al. |
| 6,574,032 B1 | 6/2003 | Roddy et al. |
| 6,577,367 B2 | 6/2003 | Kim |
| 6,650,382 B1 | 11/2003 | Sumida et al. |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,825,559 B2 | 11/2004 | Mishra et al. |
| 6,828,724 B2 | 12/2004 | Burroughes |
| 6,881,946 B2 | 4/2005 | Cok et al. |
| 6,933,532 B2 | 8/2005 | Arnold et al. |
| 6,969,624 B2 | 11/2005 | Iwafuchi et al. |
| 6,975,369 B1 | 12/2005 | Burkholder |
| 7,009,220 B2 | 3/2006 | Oohata |
| 7,012,382 B2 | 3/2006 | Cheang et al. |
| 7,091,523 B2 | 8/2006 | Cok et al. |
| 7,098,589 B2 | 8/2006 | Erchak et al. |
| 7,127,810 B2 | 10/2006 | Kasuga et al. |
| 7,129,457 B2 | 10/2006 | McElroy et al. |
| 7,157,838 B2 | 1/2007 | Thielemans et al. |
| 7,195,733 B2 | 3/2007 | Rogers et al. |
| 7,259,391 B2 | 8/2007 | Liu et al. |
| 7,288,753 B2 | 10/2007 | Cok |
| 7,394,194 B2 | 7/2008 | Cok |
| 7,402,951 B2 | 7/2008 | Cok |
| 7,408,296 B2 | 8/2008 | Cok et al. |
| 7,417,648 B2 | 8/2008 | Credelle |
| 7,466,075 B2 | 12/2008 | Cok et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,614,757 B2 | 11/2009 | Nesterenko et al. |
| 7,622,367 B1 | 11/2009 | Nuzzo et al. |
| 7,629,955 B2 | 12/2009 | Asao et al. |
| 7,662,545 B2 | 2/2010 | Nuzzo et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,872,722 B2 | 1/2011 | Kimura |
| 7,893,612 B2 | 2/2011 | Cok |
| 7,898,734 B2 | 3/2011 | Coleman et al. |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,948,172 B2 | 5/2011 | Cok et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,004,758 B2 | 8/2011 | Coleman et al. |
| 8,029,139 B2 | 10/2011 | Ellinger et al. |
| 8,039,847 B2 | 10/2011 | Nuzzo et al. |
| 8,058,663 B2 | 11/2011 | Fan et al. |
| 8,179,401 B2 | 5/2012 | Ishii |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,536,584 B2 | 9/2013 | Yao |
| 8,581,827 B2 | 11/2013 | Park et al. |
| 8,596,846 B2 | 12/2013 | Yankov et al. |
| 8,599,118 B2 | 12/2013 | Cok |
| 8,619,011 B2 | 12/2013 | Kimura |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,829,663 B2 | 9/2014 | Pohl et al. |
| 8,836,624 B2 | 9/2014 | Roberts et al. |
| 8,854,294 B2 | 10/2014 | Sakariya |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,896,505 B2 | 11/2014 | Cok et al. |
| 8,901,578 B2 | 12/2014 | Kobayakawa et al. |
| 8,902,152 B2 | 12/2014 | Bai et al. |
| 8,912,020 B2 | 12/2014 | Bedell et al. |
| 8,946,760 B2 | 2/2015 | Kim |
| 8,987,765 B2 | 3/2015 | Bibl et al. |
| 9,022,632 B2 | 5/2015 | Kim et al. |
| 9,048,449 B2 | 6/2015 | Kim et al. |
| 9,105,714 B2 | 8/2015 | Hu et al. |
| 9,105,813 B1 | 8/2015 | Chang |
| 9,153,171 B2 | 10/2015 | Sakariya et al. |
| 9,161,448 B2 | 10/2015 | Menard et al. |
| 9,178,123 B2 | 11/2015 | Sakariya et al. |
| 9,202,996 B2 | 12/2015 | Orsley et al. |
| 9,226,361 B2 | 12/2015 | Toth |
| 9,277,618 B2 | 3/2016 | Odnoblyudov et al. |
| 9,293,422 B1 | 3/2016 | Parsa et al. |
| 9,308,649 B2 | 4/2016 | Golda et al. |
| 9,329,430 B2 | 5/2016 | Erinjippurath et al. |
| 9,343,042 B2 | 5/2016 | Miller et al. |
| 9,358,775 B2 | 6/2016 | Bower et al. |
| 9,362,348 B2 | 6/2016 | Lowenthal et al. |
| 9,368,683 B1 | 6/2016 | Meitl et al. |
| 9,412,977 B2 | 8/2016 | Rohatgi |
| 9,437,782 B2 | 9/2016 | Bower et al. |
| 9,444,015 B2 | 9/2016 | Bower et al. |
| 9,520,537 B2 | 12/2016 | Bower et al. |
| 9,537,069 B1 | 1/2017 | Bower et al. |
| 9,590,025 B2 | 3/2017 | Yu et al. |
| 9,601,356 B2 | 3/2017 | Bower et al. |
| 9,626,908 B2 | 4/2017 | Sakariya et al. |
| 9,640,715 B2 | 5/2017 | Bower et al. |
| 9,698,308 B2 | 7/2017 | Bower et al. |
| 9,705,042 B2 | 7/2017 | Bower et al. |
| 9,716,082 B2 | 7/2017 | Bower et al. |
| 9,741,785 B2 | 8/2017 | Bower et al. |
| 9,818,725 B2 | 11/2017 | Bower et al. |
| 9,847,047 B2 | 12/2017 | Wu et al. |
| 9,860,955 B2 | 1/2018 | Kim et al. |

(56) References Cited

U.S. PATENT DOCUMENTS

| | | |
|---|---|---|
| 9,871,345 B2 | 1/2018 | Bower et al. |
| 9,929,053 B2 | 3/2018 | Bower et al. |
| 9,980,341 B2 | 5/2018 | Bower et al. |
| 9,991,163 B2 | 6/2018 | Bower et al. |
| 9,997,501 B2 | 6/2018 | Bower et al. |
| 10,008,483 B2 | 6/2018 | Cok et al. |
| 10,066,819 B2 | 9/2018 | Cok |
| 10,078,239 B2 | 9/2018 | Sugita et al. |
| 2001/0022564 A1 | 9/2001 | Youngquist et al. |
| 2002/0096994 A1 | 7/2002 | Iwafuchi et al. |
| 2002/0118321 A1 | 8/2002 | Ge |
| 2002/0140646 A1 | 10/2002 | Sato et al. |
| 2002/0171792 A1 | 11/2002 | Kubota et al. |
| 2002/0171801 A1 | 11/2002 | Hsieh et al. |
| 2003/0001165 A1 | 1/2003 | Taki |
| 2004/0080483 A1 | 4/2004 | Chosa |
| 2004/0080941 A1 | 4/2004 | Jiang et al. |
| 2004/0135160 A1 | 7/2004 | Cok |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0194606 A1 | 9/2005 | Oohata |
| 2005/0202595 A1 | 9/2005 | Yonehara et al. |
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |
| 2006/0063309 A1 | 3/2006 | Sugiyama et al. |
| 2006/0180818 A1 | 8/2006 | Nagai et al. |
| 2006/0246811 A1 | 11/2006 | Winters et al. |
| 2006/0273862 A1 | 12/2006 | Shimmura |
| 2006/0289972 A1 | 12/2006 | Nishimura et al. |
| 2007/0035340 A1 | 2/2007 | Kimura |
| 2007/0077349 A1 | 4/2007 | Newman et al. |
| 2007/0182809 A1 | 8/2007 | Yarid et al. |
| 2007/0201056 A1 | 8/2007 | Cok et al. |
| 2008/0108171 A1 | 5/2008 | Rogers et al. |
| 2008/0211734 A1 | 9/2008 | Huitema et al. |
| 2008/0296717 A1 | 12/2008 | Beroz et al. |
| 2009/0045420 A1 | 2/2009 | Eng et al. |
| 2009/0140630 A1 | 6/2009 | Kijima et al. |
| 2009/0146921 A1 | 6/2009 | Takahashi |
| 2009/0278142 A1 | 11/2009 | Watanabe et al. |
| 2009/0284696 A1 | 11/2009 | Cheong et al. |
| 2009/0295706 A1 | 12/2009 | Feng |
| 2009/0315054 A1 | 12/2009 | Kim et al. |
| 2010/0038655 A1 | 2/2010 | Chen et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0149117 A1 | 6/2010 | Chien et al. |
| 2010/0186883 A1 | 7/2010 | Tomoda |
| 2010/0190293 A1 | 7/2010 | Maeda et al. |
| 2010/0201253 A1 | 8/2010 | Cok et al. |
| 2010/0207852 A1 | 8/2010 | Cok |
| 2010/0213819 A1 | 8/2010 | Cok et al. |
| 2010/0214245 A1 | 8/2010 | Hirota |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0270912 A1 | 10/2010 | Ko |
| 2010/0289115 A1 | 11/2010 | Akiyama et al. |
| 2010/0317132 A1 | 12/2010 | Rogers et al. |
| 2010/0321414 A1 | 12/2010 | Muroi et al. |
| 2010/0328268 A1 | 12/2010 | Teranishi et al. |
| 2011/0032277 A1* | 2/2011 | Lee ............... G09G 3/3225 |
| | | 345/690 |
| 2011/0043435 A1 | 2/2011 | Hebenstreit et al. |
| 2011/0069013 A1 | 3/2011 | Rabenstein et al. |
| 2011/0108800 A1 | 5/2011 | Pan |
| 2011/0120678 A1 | 5/2011 | Palm |
| 2011/0205448 A1 | 8/2011 | Takata |
| 2011/0211348 A1 | 9/2011 | Kim |
| 2011/0242027 A1 | 10/2011 | Chang |
| 2011/0309378 A1 | 12/2011 | Lau et al. |
| 2011/0316008 A1 | 12/2011 | Yokogawa |
| 2012/0018745 A1 | 1/2012 | Liu et al. |
| 2012/0049222 A1 | 3/2012 | Yoshizumi et al. |
| 2012/0056835 A1 | 3/2012 | Choo et al. |
| 2012/0062135 A1* | 3/2012 | Tamaki ............... H05B 33/08 |
| | | 315/210 |
| 2012/0105518 A1 | 5/2012 | Kang et al. |
| 2012/0119249 A1 | 5/2012 | Kim et al. |
| 2012/0126229 A1 | 5/2012 | Bower |
| 2012/0141799 A1 | 6/2012 | Kub et al. |
| 2012/0193652 A1 | 8/2012 | Horng et al. |
| 2012/0206428 A1 | 8/2012 | Cok |
| 2012/0206499 A1 | 8/2012 | Cok |
| 2012/0212465 A1 | 8/2012 | White et al. |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0236022 A1 | 9/2012 | Homma et al. |
| 2012/0256163 A1 | 10/2012 | Yoon et al. |
| 2012/0274669 A1 | 11/2012 | Neal |
| 2012/0281028 A1 | 11/2012 | Orlick et al. |
| 2012/0314388 A1 | 12/2012 | Bower et al. |
| 2012/0320566 A1 | 12/2012 | Namekata |
| 2012/0320581 A1 | 12/2012 | Rogers et al. |
| 2012/0326175 A1 | 12/2012 | Hu et al. |
| 2013/0006524 A1 | 1/2013 | Sasaki et al. |
| 2013/0010405 A1 | 1/2013 | Rothkopf et al. |
| 2013/0015483 A1 | 1/2013 | Shimokawa et al. |
| 2013/0016494 A1 | 1/2013 | Speier et al. |
| 2013/0036928 A1 | 2/2013 | Rogers et al. |
| 2013/0069275 A1 | 3/2013 | Menard et al. |
| 2013/0088416 A1 | 4/2013 | Smith et al. |
| 2013/0128585 A1 | 5/2013 | Bibl et al. |
| 2013/0153277 A1 | 6/2013 | Menard et al. |
| 2013/0153934 A1 | 6/2013 | Meitl et al. |
| 2013/0161667 A1 | 6/2013 | Chen et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0248889 A1 | 9/2013 | Lin |
| 2013/0257264 A1 | 10/2013 | Tamaki et al. |
| 2013/0273695 A1 | 10/2013 | Menard et al. |
| 2013/0278513 A1 | 10/2013 | Jang |
| 2014/0014960 A1 | 1/2014 | Yamazaki et al. |
| 2014/0027709 A1 | 1/2014 | Higginson et al. |
| 2014/0082934 A1 | 3/2014 | Cok |
| 2014/0084240 A1 | 3/2014 | Hu et al. |
| 2014/0084482 A1 | 3/2014 | Hu et al. |
| 2014/0085214 A1 | 3/2014 | Cok |
| 2014/0094878 A1 | 4/2014 | Gossler et al. |
| 2014/0104157 A1 | 4/2014 | Burns et al. |
| 2014/0104243 A1 | 4/2014 | Sakariya et al. |
| 2014/0111442 A1 | 4/2014 | Cok et al. |
| 2014/0146273 A1 | 5/2014 | Kim et al. |
| 2014/0151715 A1 | 6/2014 | Smirnov et al. |
| 2014/0159043 A1 | 6/2014 | Sakariya et al. |
| 2014/0159065 A1 | 6/2014 | Hu et al. |
| 2014/0168037 A1 | 6/2014 | Sakariya et al. |
| 2014/0175498 A1 | 6/2014 | Lai |
| 2014/0183446 A1 | 7/2014 | Nago et al. |
| 2014/0192079 A1* | 7/2014 | Lee ............... G09G 5/02 |
| | | 345/597 |
| 2014/0197509 A1 | 7/2014 | Haddad et al. |
| 2014/0198373 A1 | 7/2014 | Ray |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0240617 A1 | 8/2014 | Fukutome et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |

(56) References Cited

U.S. PATENT DOCUMENTS

| | | | |
|---|---|---|---|
| 2014/0319486 A1* | 10/2014 | Hong | G09G 3/32 257/40 |
| 2014/0339495 A1 | 11/2014 | Bibl et al. | |
| 2014/0340900 A1 | 11/2014 | Bathurst et al. | |
| 2014/0367633 A1 | 12/2014 | Bibl et al. | |
| 2014/0367705 A1 | 12/2014 | Bibl et al. | |
| 2015/0003040 A1 | 1/2015 | Bessho et al. | |
| 2015/0015517 A1 | 1/2015 | Zhao | |
| 2015/0021632 A1 | 1/2015 | Taghizadeh et al. | |
| 2015/0135525 A1 | 5/2015 | Bower | |
| 2015/0137153 A1 | 5/2015 | Bibl et al. | |
| 2015/0169011 A1 | 6/2015 | Bibl et al. | |
| 2015/0170602 A1 | 6/2015 | Kang | |
| 2015/0179453 A1 | 6/2015 | Cheng et al. | |
| 2015/0255438 A1 | 9/2015 | Oraw et al. | |
| 2015/0263066 A1 | 9/2015 | Hu et al. | |
| 2015/0263256 A1 | 9/2015 | Hsieh et al. | |
| 2015/0279822 A1 | 10/2015 | Hsu | |
| 2015/0280066 A1 | 10/2015 | Fujimura et al. | |
| 2015/0280089 A1 | 10/2015 | Obata et al. | |
| 2015/0296580 A1 | 10/2015 | Kim et al. | |
| 2015/0308634 A1 | 10/2015 | van de Ven et al. | |
| 2015/0318328 A1* | 11/2015 | Bibl | H01L 51/50 257/89 |
| 2015/0327388 A1 | 11/2015 | Menard et al. | |
| 2015/0362165 A1 | 12/2015 | Chu et al. | |
| 2015/0370130 A1 | 12/2015 | Lin | |
| 2015/0371585 A1 | 12/2015 | Bower et al. | |
| 2015/0371974 A1 | 12/2015 | Bower et al. | |
| 2015/0372051 A1 | 12/2015 | Bower et al. | |
| 2015/0372052 A1 | 12/2015 | Bower et al. | |
| 2015/0372053 A1 | 12/2015 | Bower et al. | |
| 2015/0372187 A1 | 12/2015 | Bower et al. | |
| 2015/0373793 A1 | 12/2015 | Bower et al. | |
| 2016/0004123 A1 | 1/2016 | Tanabe | |
| 2016/0005721 A1 | 1/2016 | Bower et al. | |
| 2016/0018094 A1 | 1/2016 | Bower et al. | |
| 2016/0056725 A1 | 2/2016 | Kim et al. | |
| 2016/0057822 A1 | 2/2016 | Chu | |
| 2016/0057827 A1 | 2/2016 | Miskin | |
| 2016/0057832 A1 | 2/2016 | Briggs et al. | |
| 2016/0064363 A1 | 3/2016 | Bower et al. | |
| 2016/0085120 A1 | 3/2016 | Xu | |
| 2016/0093600 A1 | 3/2016 | Bower et al. | |
| 2016/0103547 A1 | 4/2016 | Lu et al. | |
| 2016/0131329 A1 | 5/2016 | Park et al. | |
| 2016/0163765 A1 | 6/2016 | Hu et al. | |
| 2016/0210895 A1 | 7/2016 | Fan et al. | |
| 2016/0211245 A1 | 7/2016 | Do | |
| 2016/0260388 A1 | 9/2016 | Yata et al. | |
| 2016/0266697 A1 | 9/2016 | Cheng et al. | |
| 2016/0343772 A1 | 11/2016 | Bower et al. | |
| 2016/0351539 A1 | 12/2016 | Bower et al. | |
| 2016/0364030 A1 | 12/2016 | Peana et al. | |
| 2016/0370855 A1 | 12/2016 | Lanier et al. | |
| 2017/0005244 A1 | 1/2017 | Bower et al. | |
| 2017/0010706 A1 | 1/2017 | Cok | |
| 2017/0025075 A1 | 1/2017 | Cok et al. | |
| 2017/0025395 A1 | 1/2017 | Chen et al. | |
| 2017/0025484 A1 | 1/2017 | Forrest et al. | |
| 2017/0047393 A1 | 2/2017 | Bower et al. | |
| 2017/0048976 A1 | 2/2017 | Prevatte et al. | |
| 2017/0068362 A1 | 3/2017 | Den Boer et al. | |
| 2017/0092863 A1 | 3/2017 | Bower et al. | |
| 2017/0102797 A1 | 4/2017 | Cok | |
| 2017/0122502 A1 | 5/2017 | Cok et al. | |
| 2017/0133818 A1 | 5/2017 | Cok | |
| 2017/0148771 A1 | 5/2017 | Cha et al. | |
| 2017/0167703 A1 | 6/2017 | Cok | |
| 2017/0186740 A1 | 6/2017 | Cok et al. | |
| 2017/0187976 A1 | 6/2017 | Cok | |
| 2017/0206845 A1 | 7/2017 | Sakariya et al. | |
| 2017/0221266 A1 | 8/2017 | Schubert et al. | |
| 2017/0250167 A1 | 8/2017 | Bower et al. | |
| 2017/0250219 A1 | 8/2017 | Bower et al. | |
| 2017/0256521 A1 | 9/2017 | Cok et al. | |
| 2017/0256522 A1 | 9/2017 | Cok et al. | |
| 2017/0287882 A1 | 10/2017 | Cok et al. | |
| 2017/0338374 A1 | 11/2017 | Zou et al. | |
| 2017/0352646 A1 | 12/2017 | Bower et al. | |
| 2017/0352647 A1 | 12/2017 | Raymond et al. | |
| 2017/0357127 A1 | 12/2017 | Cok et al. | |
| 2017/0358717 A1 | 12/2017 | Cok et al. | |
| 2018/0007750 A1 | 1/2018 | Meitl et al. | |
| 2018/0033853 A1 | 2/2018 | Bower et al. | |
| 2018/0041005 A1 | 2/2018 | Bower et al. | |
| 2018/0084614 A1 | 3/2018 | Bower et al. | |
| 2018/0119931 A1 | 5/2018 | Bower et al. | |
| 2018/0130400 A1 | 5/2018 | Meitl et al. | |
| 2018/0174932 A1 | 6/2018 | Cok et al. | |
| 2018/0197471 A1 | 7/2018 | Rotzoll et al. | |
| 2018/0211945 A1 | 7/2018 | Cok et al. | |
| 2018/0226386 A1 | 8/2018 | Cok | |
| 2018/0277525 A1 | 9/2018 | Cok et al. | |
| 2018/0323180 A1 | 11/2018 | Cok | |
| 2018/0340681 A1 | 11/2018 | Cok | |
| 2019/0027534 A1 | 1/2019 | Rotzoll et al. | |

FOREIGN PATENT DOCUMENTS

| | | | |
|---|---|---|---|
| EP | 2078978 | A2 | 7/2009 |
| EP | 2148264 | A2 | 1/2010 |
| EP | 2 610 314 | A1 | 7/2013 |
| EP | 2703969 | A2 | 3/2014 |
| JP | 11-142878 | | 5/1999 |
| JP | 2010-103186 | A | 5/2010 |
| JP | 2013-221965 | A | 10/2013 |
| WO | WO-2006/027730 | A1 | 3/2006 |
| WO | WO-2006/099741 | A1 | 9/2006 |
| WO | WO-2008/103931 | A2 | 8/2008 |
| WO | WO-2010/032603 | A1 | 3/2010 |
| WO | WO-2010/111601 | A2 | 9/2010 |
| WO | WO-2010/132552 | A1 | 11/2010 |
| WO | WO-2013/011415 | A1 | 1/2013 |
| WO | WO-2013/064800 | A1 | 5/2013 |
| WO | WO-2014/121635 | A1 | 8/2014 |
| WO | WO-2014/149864 | A1 | 9/2014 |
| WO | WO-2015/088629 | A1 | 6/2015 |
| WO | WO-2015/193434 | A2 | 12/2015 |
| WO | WO-2016/030422 | A1 | 3/2016 |
| WO | WO-2016/046283 | A2 | 3/2016 |
| WO | WO-2017/042252 | A1 | 3/2017 |
| WO | WO-2017/060487 | A2 | 4/2017 |
| WO | WO-2017/149067 | A1 | 9/2017 |
| WO | WO-2017/174632 | A1 | 10/2017 |

OTHER PUBLICATIONS

International Search Report, PCT/EP2015/069553, dated Nov. 27, 2015, 6 pages.
Lee, S. H. et al, Laser Lift-Off of GaN Thin Film and its Application to the Flexible Light Emitting Diodes, Proc. of SPIE 8460:846011-1-846011-6 (2012).
U.S. Appl. No. 14/822,868, Bower et al.
Choi, H. W. et al., Efficient GaN-based Micro-LED Arrays, Mat. Res. Soc. Symp. Proc. 743:L6.28.1-L6.28.6 (2003).
Poher, V. et al., Micro-LED arrays: a tool for two-dimensional neuron stimulation, J. Phys. D: Appl. Phys. 41:094014 (2008).
U.S. Appl. No. 14/788,632, filed Jun. 30, 2015, X-Celeprint Limited.
U.S. Appl. No. 14/807,311, filed Jul. 23, 2015, X-Celeprint Limited.
U.S. Appl. No. 14/822,866, filed Aug. 10, 2015, Bower et al.
Cok, R. S. et al., AMOLED displays with transfer-printed integrated circuits, Journal of SID 19/(4):335-341(2011).
Hamer et al., "63.2: AMOLED Displays Using Transfer-Printed Integrated Circuits," SID 09 DIGEST, 40(2):947-950 (2009).
Johnson, K. et al., Advances in Red VCSEL Technology, Advances in Optical Technologies, 2012:569379, 13 pages (2012).
Kasahara, D. et al, Nichia reports first room-temperature blue/'green' VCSELs with current injection, Appl. Phys. Express, 4(7):3 pages (2011).

(56) References Cited

OTHER PUBLICATIONS

Koma, N. et al., 44.2: Novel Front-light System Using Fine-pitch Patterned OLED, SID, 08:655-658 (2008).

Seurin, J.F. et al, High-power red VCSEL arrays, Proc. of SPIE 8639:1-9 (2013).

Yoon, J. et al., Heterogeneously Integrated Optoelectronic Devices Enabled by MicroTransfer Printing, Adv. Optical Mater. 3:1313-1335 (2015).

Matioli, E. et al., High-brightness polarized light-emitting diodes, Light: Science & Applications, 1:e22:1-7 (2012).

Roscher, H., VCSEL Arrays with Redundant Pixel Designs for 10Gbits/s 2-D Space-Parallel MMF Transmission, Annual Report, optoelectronics Department, (2005).

Yaniv et al., A 640×480 Pixel Computer Display Using Pin Diodes with Device Redundancy, 1988 International Display Research Conference, IEEE, CH-2678-1/88:152-154 (1988).

Yu, Jennifer and Bulovic, Vladimir, Micropatterning metal electrode of organic light emitting devices using rapid polydimethylsiloxane lift-off, Applied Physics Letters, 91:043102-1-043102-3, (2007).

Bower, C. A. et al., Transfer Printing: An Approach for Massively Parallel Assembly of Microscale Devices, IEE, Electronic Components and Technology Conference, (2008).

Cok, R. S. et al., 60.3: AMOLED Displays Using Transfer-Printed Integrated Circuits, Society for Information Display, 10:902-904, (2010).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties?, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructural elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

* cited by examiner

HETEROGENEOUS LIGHT EMITTER DISPLAY SYSTEM

FIELD OF THE INVENTION

The present invention relates to display systems having pixels that include sub-pixels emitting different colors of light. A sub-pixel includes at least two different light emitters.

BACKGROUND OF THE INVENTION

Flat-panel displays are widely used in conjunction with computing devices, in portable devices, and for entertainment devices such as televisions. Such displays typically employ a plurality of pixels distributed over a display substrate to display images, graphics, or text. In a color display, each pixel includes light emitters that emit light of different colors, such as red, green, and blue. For example, liquid crystal displays (LCDs) employ liquid crystals to block or transmit light from a backlight behind the liquid crystals and organic light-emitting diode (OLED) displays rely on passing current through a layer of organic material that glows in response to the current. Displays using inorganic light emitting diodes (LEDs) are also in widespread use for outdoor signage and have been demonstrated in a 55-inch television.

The various light-emitting technologies have different characteristics, advantages, and disadvantages. For example, liquid crystals are simple to control and have a highly developed and sophisticated technological infrastructure. Organic LEDs are area emitters, can be more efficient and flexible, and are demonstrated in a very thin form factor. Inorganic light-emitting diodes are very efficient and provide relatively saturated light in an environmentally robust structure. Lasers are also efficient, provide a virtually monochromatic light, but have a limited viewing angle. None of these technologies, however, meet all of a display viewer's needs under all circumstances.

In any application requiring many elements, it is important that each element is reliable to ensure good manufacturing yields and performance. Active-matrix control circuits, as well as the controlled element (e.g., a light emitter) are subject to failure. Because no manufacturing process is perfect, any large system can have defective elements. To ensure that large multi-element systems are reliably manufactured and operated, some systems employ identical, redundant elements. For example, displays are sometimes designed with redundant light emitters. U.S. Pat. No. 5,621,555 describes an LCD with redundant pixel electrodes and thin-film transistors to reduce defects. In another approach described in U.S. Pat. No. 6,577,367, an extra row or column of pixels is provided to replace any defective row or column.

An alternative approach to improving display yields uses additional, redundant light-emitting elements, for example two light emitters for every desired light emitter in the display. U.S. Pat. No. 8,766,970 discloses a pixel circuit with two sub-pixels and circuitry to determine whether a sub-pixel is to be enabled, for example if another sub-pixel is faulty. Similarly, U.S. Pat. No. 7,012,382 teaches an LED-based light system that includes a primary light source and at least one redundant light source. The primary light source is activated by itself and the performance of the light source is measured to determine whether or not to drive the redundant light source. The redundant light source is activated when the performance measurements indicate that a performance characteristic is not being met by the primary light source alone. The first light system can be activated in combination with the redundant light source once the decision is made to activate the redundant light source. U.S. Pat. No. 8,791,474 discloses redundant pairs of micro LED devices driven by a common transistor. WO 2014149864 describes separately controlled LED devices. However, such redundant systems, although they can improve yields, do not meet a wider variety of needs in a display.

There is a need, therefore, for a display system that can meet a wider variety of needs in a greater variety of viewing circumstances.

SUMMARY OF THE INVENTION

The present invention is a display with pixels having sub-pixels or double pixels with two or more heterogeneous light emitters. Because the two or more heterogeneous light emitters are different light emitters, they have different attributes that are useful under different viewing situation and circumstances. By controlling the different light emitters so as to improve their operation in different situations, a display having improved performance under a wider variety of circumstances is provided.

In one aspect, the disclosed technology includes a heterogeneous light-emitter display, including: a display substrate having a plurality of pixels disposed thereon, each pixel comprising at least a first heterogeneous multiple-component sub-pixel emitting a first color of light and a second sub-pixel emitting a second color of light different from the first color; and one or more pixel controllers for controlling the pixels and the first and second sub-pixels.

In certain embodiments, each pixel comprises a red sub-pixel that emits red light, a green sub-pixel that emits green light, and a blue sub-pixel that emits blue light.

In certain embodiments, the first heterogeneous multiple-component sub-pixel comprises a first light emitter and a second light emitter different from the first light emitter.

In certain embodiments, the first light emitter emits a different hue, tint, or shade of a color of light than the second light emitter in response to a common control signal.

In certain embodiments, wherein the first light emitter emits a different spectrum of light than the second light emitter.

In certain embodiments, the first light emitter has a different size than the second light emitter.

In certain embodiments, the first light emitter emits a different brightness than the second light emitter in response to a common control signal.

In certain embodiments, the first light emitter has a different efficiency than the second light emitter.

In certain embodiments, the first light emitter has a different angular distribution of emitted light than the second light emitter.

In certain embodiments, the first light emitter has a different electronic property or response than the second light emitter.

In certain embodiments, the first light emitter emits light using a different physical mechanism than the second light emitter.

In certain embodiments, the first light emitter has a different physical structure than the second light emitter.

In certain embodiments, the first light emitter emits a different hue, tint, or shade of a color of light than the second light emitter in response to a common control signal, the first light emitter emits a different spectrum of light than the second light emitter, the first light emitter has a different size than the second light emitter, the first light emitter emits a different brightness than the second light emitter in response to a common control signal, the first light emitter has a different efficiency than the second light emitter, the first light emitter has a different angular distribution of emitted light than the second light emitter, the first light emitter has a different electronic property or response than the second light emitter, the first light emitter emits light using a different physical mechanism than the second light emitter, or the first light emitter has a different physical structure than the second light emitter.

In certain embodiments, the first light emitter and the second light emitter mutually compensate for at least one difference in the other emitter.

In certain embodiments, the second sub-pixel is a heterogeneous multiple-component sub-pixel.

In certain embodiments, the second sub-pixel comprises a first light emitter and a second light emitter different from the first light emitter.

In certain embodiments, the display includes a third sub-pixel that emits light of a third color of light different from the first color and different from the second color.

In certain embodiments, the third sub-pixel is a heterogeneous sub-pixel.

In certain embodiments, the third sub-pixel comprises a first light emitter and a second light emitter different from the first light emitter.

In certain embodiments, the pixel controller comprises a control circuit that controls the first light emitter in parallel with the second light emitter, in series with the second light emitter, or separately from the second light emitter.

In certain embodiments, the first light emitter is an inorganic light emitter, an organic light emitter, an inorganic light-emitting diode, an organic light-emitting diode, a laser, a vertical cavity surface emission laser, or an optically pumped or electrically controlled phosphor, nano-crystal, or quantum dot.

In certain embodiments, the second light emitter is an inorganic light emitter, an organic light emitter, an inorganic light-emitting diode, an organic light-emitting diode, a laser, a vertical cavity surface emission laser, or an optically pumped or electrically controlled phosphor, nano-crystal, or quantum dot.

In certain embodiments, the first light emitter is an inorganic light-emitter and the second light emitter is an organic light-emitter.

In certain embodiments, the first light emitter is an inorganic light-emitting diode and the second light emitter is an organic light-emitting diode.

In certain embodiments, the first light emitter is a laser and the second light emitter is an inorganic light-emitting diode.

In certain embodiments, the first light emitter is a relatively smaller light-emitting diode and the second light emitter is relatively larger light-emitting diode.

In certain embodiments, the first and second light emitters of the heterogeneous sub-pixels of the plurality of pixels have corresponding first and second distributions of light emission frequencies, and wherein the combination of the first and second distributions is less variable than the each of the first and second distributions.

In certain embodiments, the pixel controller comprises a control circuit that controls the first light emitter differently from the second light emitter.

In certain embodiments, the pixel controller comprises a control circuit that controls the first light emitter differently from the second light emitter.

In certain embodiments, the operational difference varies in response to different control signals.

In certain embodiments, the pixel controller comprises a control circuit that controls the first light emitter to emit light corresponding to a first brightness and the second light emitter to emit light corresponding to a second brightness different from the first brightness.

In certain embodiments, the pixel controller comprises a control circuit that controls the first light emitter to emit light corresponding to a first image pixel and the second light emitter to emit light corresponding to a second image pixel different from the first image pixel.

In certain embodiments, the pixel controller controls the first and second light emitters to emit light corresponding to the same image pixel.

In certain embodiments, the pixel controller comprises a control circuit that controls the first light emitter to emit light corresponding to a first image pixel and the second light emitter to emit light corresponding to a second image pixel different from the first image pixel.

In certain embodiments, the pixel controller controls the first light emitter to emit light corresponding to a first image pixel and the second light emitter to emit light corresponding to the same image pixel.

In certain embodiments, the pixels are spatially distributed and wherein the first and second light emitters in a sub-pixel are adjacent.

In certain embodiments, the second sub-pixel comprises one or more light emitters, wherein the pixels are spatially distributed, and wherein the first and second light emitters in the first sub-pixel are spatially separated by the one or more light emitters of the second sub-pixel.

In certain embodiments, the first and second sub-pixels in a pixel are separated by the same distance separating spatially adjacent pixels.

In certain embodiments, one of the first light emitter and the second light emitter has a light-emitter substrate separate and distinct from the display substrate, wherein the first light emitter and the second light emitter each has a light-emitter substrate and the light-emitter substrate of the first light emitter is separate and distinct from the light-emitter substrate of the second light emitter.

In certain embodiments, the first light emitter and the second light emitter are disposed on a common pixel substrate and the pixel substrate is disposed on the display substrate.

In certain embodiments, the display includes a display substrate and wherein the display substrate is a member selected from the group consisting of polymer, plastic, resin, polyimide, PEN, PET, metal, metal foil, glass, a semiconductor, and sapphire.

In certain embodiments, the display includes a display substrate and wherein the display substrate has a transparency greater than or equal to 50%, 80%, 90%, or 95% for visible light.

In certain embodiments, the display includes a display substrate with a contiguous display area comprising the plurality of pixels, the plurality of light emitters each having a light-emissive area, and the combined light-emissive areas of the plurality of light emitters is less than or equal to one-quarter of the contiguous display area.

In certain embodiments, the combined light-emissive areas of the plurality of light emitters is less than or equal to one eighth, one tenth, one twentieth, one fiftieth, one hundredth, one five-hundredth, one thousandth, one two-thousandth, or one ten-thousandth of the contiguous display area.

In certain embodiments, each of the plurality of pixels comprises at least one light emitter, and the light emitters have a width from 2 to 5 µm, 5 to 10 µm, 10 to 20 µm, or 20 to 50 µm.

In certain embodiments, each of the plurality of pixels comprises at least one light emitter, and each of the light emitters has a length from 2 to 5 µm, 5 to 10 µm, 10 to 20 µm, or 20 to 50 µm.

In certain embodiments, each of the plurality of pixels comprises at least one light emitter, and each of the light emitters has a height from 2 to 5 µm, 4 to 10 µm, 10 to 20 µm, or 20 to 50 µm.

In certain embodiments, the display includes a display substrate having a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In another aspect, the disclosed technology includes a heterogeneous light-emitter display, including: a display substrate having an array of heterogeneous double pixels disposed thereon, each pixel of the double pixel comprising at least first and second sub-pixels that emit corresponding first and second different colors of light; the heterogeneous double pixels comprising a plurality of first pixels and a plurality of second pixels, the first sub-pixel of each of the first pixels comprising a first light emitter and the first sub-pixel of each of the second pixels comprising a second light emitter different from the first light emitter; and one or more pixel controllers for controlling the pixels, the first and second pixels, the first and second sub-pixels, and the first and second light emitters.

In certain embodiments, the second sub-pixel of each of the first pixels comprises a first light emitter and the second sub-pixel of each of the second pixels comprises a second light emitter different from the first light emitter, or wherein the third sub-pixel of each of the first pixels comprises a first light emitter and the third sub-pixel of each of the second pixels comprises a second light emitter different from the first light emitter, or both.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
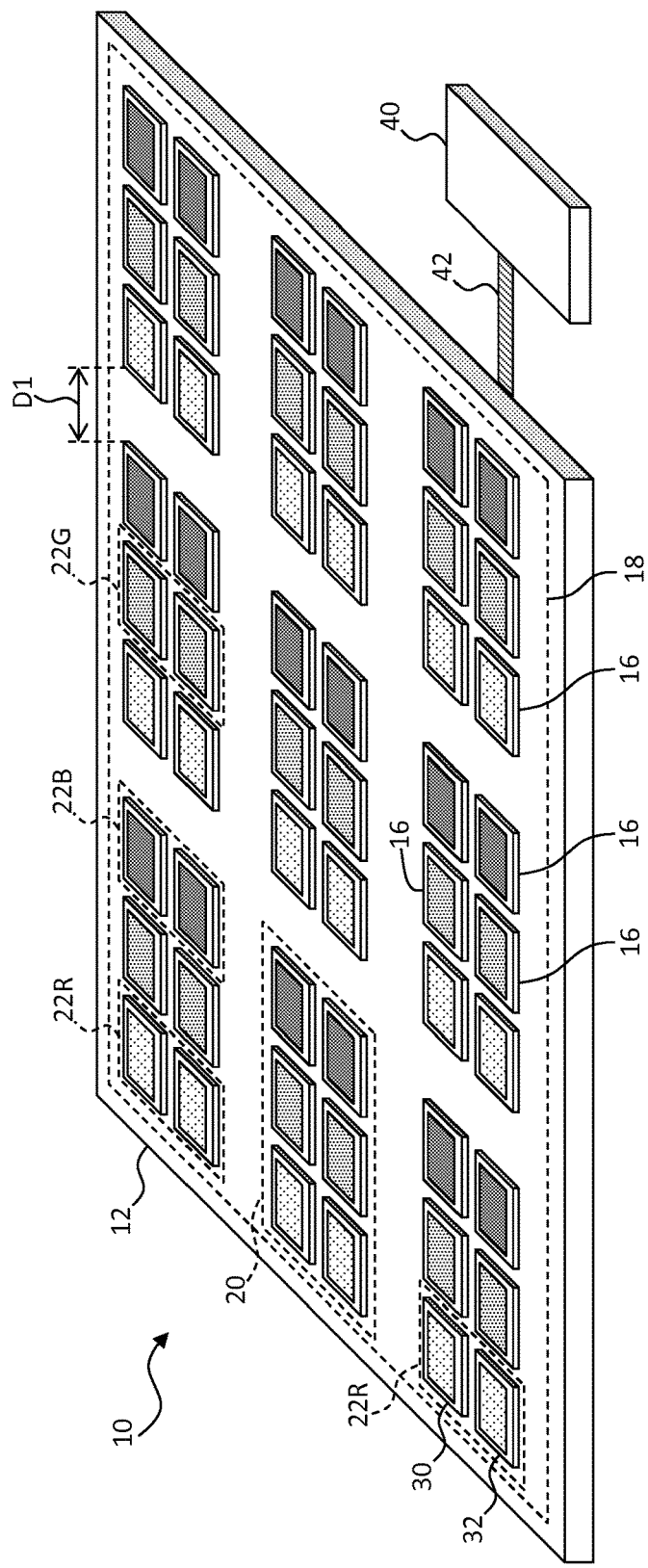
FIG. 1 is a perspective of an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Figure 2:
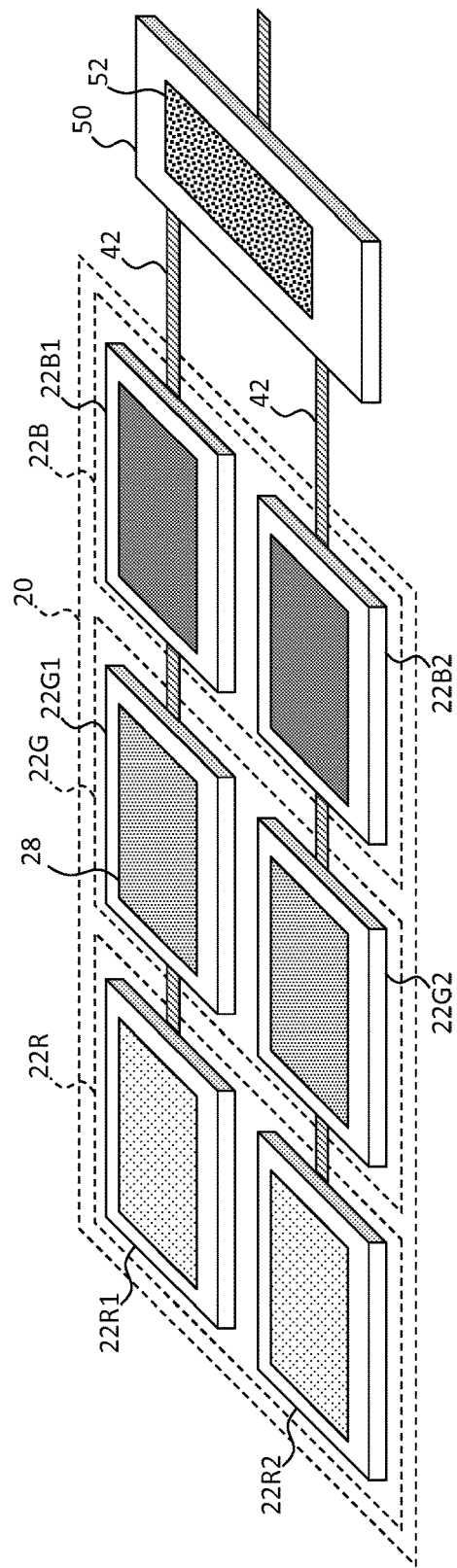
FIG. 2 is a perspective of a pixel according to an embodiment of the present invention.

Referring to the perspective of FIG. 1 and the more detailed perspective of FIG. 2, a heterogeneous light-emitter display 10 includes a display substrate 12. A plurality of pixels 20 is disposed over, in, or on the display substrate 12. Each pixel 20 includes at least a heterogeneous multi-component sub-pixel and another sub-pixel that each emit different colors of light. In certain embodiments, the sub-pixels are all heterogeneous multi-component sub-pixels, as shown in FIG. 1. In other embodiments, one or more of the sub-pixels are not heterogeneous sub-pixels.

In the example of FIGS. 1 and 2, the first heterogeneous multi-component sub-pixel 22R emits a first color of light (e.g., red) and the second sub-pixel 22G emits a second color of light (e.g., green) different from the first color. As shown in FIG. 1, each pixel 20 also includes a third sub-pixel 22B that emits a third color of light (e.g., blue) different from the first and second colors of light. As described herein, sub-pixel 22 refers generically to any of the sub-pixels of the pixels 20.

FIG. 1 illustrates a heterogeneous light-emitter display 10 with an array of nine full-color pixels 20. Nine full-color pixels 20 are shown for illustrative purposes; however, displays with thousands or millions of full-color pixels 20 are contemplated. Each full-color pixel 20 includes three heterogeneous multi-component sub-pixels 22, a red sub-pixel 22R that emits red light, a green sub-pixel 22G that emits green light, and a blue sub-pixel 22B that emits blue light. For clarity, in FIG. 1 the heterogeneous sub-pixels 22 (i.e., the red sub-pixel 22R, the green sub-pixel 22G, and the blue sub-pixel 22B) are indicated by dashed lines for different pixels 20. Nonetheless, in FIG. 1 each pixel 20 illustrated includes three heterogeneous multi-component sub-pixels 22, a red sub-pixel 22R, a green sub-pixel 22G, and a blue sub-pixel 22B. As used herein, the term pixel refers to a display pixel, that is a set of light emitters in a display that are intended to emit an amount and color of light corresponding to an image pixel. Sub-pixels are elements within a display pixel that emit one of the colors of the pixel. Unless otherwise described, a pixel is a display pixel and a sub-pixel is a display sub-pixel.

The heterogeneous multi-component sub-pixel 22 has a component that is a first light emitter 30 and a component that is a second light emitter 32 different from the first light emitter 30. In one embodiment, only one sub-pixel 22 of the pixel 20 is a heterogeneous multi-component sub-pixel 22. In another embodiment, as illustrated in FIGS. 1 and 2 for example, all of the sub-pixels of the pixels 20 are heterogeneous multi-component sub-pixels 22 that each include first and second light emitters 30, 32. FIG. 1 illustrates full-color pixels 20 each with three heterogeneous multi-component sub-pixels 22 (red, green, and blue sub-pixels 22R, 22G, 22B) that each include a first light emitter 30 and a second light emitter 32 different from the first light emitter 30. For brevity, the heterogeneous multi-component sub-pixels 22 are also described herein as heterogeneous sub-pixels 22. The first and second light emitters 30, 32 are enclosed in a contiguous display area 18 of the display substrate 12.

A display controller 40 is also a pixel controller that controls the pixels 20, sub-pixels 22, and light emitters 30, 32, for example, through wires 42, a bus, other electrical connections, or a combination thereof between the pixels 20 and the display controller 40. In certain embodiments, a control circuit is used to control the pixels 20 in response to signals from the display controller 40. (For clarity, not all of the wires 42 are shown in FIG. 1.) In an embodiment the display controller 40 is also a pixel controller. In certain embodiments, multiple pixels 20 are controlled by a common pixel controller. The display controllers 40 can include one or more circuits in one or more packages (e.g., integrated circuits) and be distributed in various locations. For example, in certain embodiments, spatially separated separate circuits for controlling the sub-pixels collectively forms a pixel controller. Similarly, in certain embodiments, a collection of separate pixel controllers effectively form a display controller 40. The first and second light emitters 30, 32 can also include circuits. The pixels 20 are separated by an inter-pixel separation distance D1.

As shown further in the more detailed perspective of FIG. 2, in another embodiment, each pixel 20 is controlled by an individual pixel controller 50 having a control circuit 52 under the direction of the display controller 40 (not shown in FIG. 2), for example through wires 42 or buses supplying control, power, or ground signals. Each pixel 20 includes a first heterogeneous red sub-pixel 22R, a heterogeneous green sub-pixel 22G, and a heterogeneous blue sub-pixel 22B. (In other embodiments, not shown, only one or two of the sub-pixels is a heterogeneous sub-pixel 22 with two or more different light emitters.) As shown in FIG. 2, the heterogeneous red sub-pixel 22R includes a first red light emitter 22R1 that emits red light and a second red light emitter 22R2 different from the first red light emitter 22R1 that emits red light. The heterogeneous green sub-pixel 22G includes a first green light emitter 22G1 that emits green light and a second green light emitter 22G2 different from the first green light emitter 22G1 that emits green light. The heterogeneous blue sub-pixel 22B includes a first blue light emitter 22B1 that emits blue light and a second blue light emitter 22B2 different from the first blue light emitter 22B1 that emits blue light. In certain embodiments, pixels 20 include a fourth sub-pixel that emits a fourth color of light, such as yellow or cyan.

The first and second light emitters 30, 32 (FIG. 1) of each sub-pixel 22 (e.g., first green light emitter 22G1 and second green light emitter 22G2) each have a light-emissive area 28. The light-emissive area 28 of the first light emitter 30 can be different, or the same, as the light-emissive area 28 of the second light emitter 32. For example, the second light emitter 32 can have a larger light-emissive area 28 than the first light emitter 30 in the same heterogeneous sub-pixel 22.

A heterogeneous sub-pixel 22 is a sub-pixel that includes heterogeneous or different first and second light emitters 30, 32 that are not alike, or are dissimilar, that are different in kind, or are composed of parts of different kinds, different elements, or constituents. As intended herein, heterogeneous light emitters are light emitters that are intended to operate or function differently even when driven with common control signals. For example, heterogeneous light emitters can operate differently, have different functions, or function differently. Similar devices that are made and intended to function identically are not considered heterogeneous devices herein, even if unavoidable and unintended differences exist between the similar devices. For example, it is known that because of manufacturing and material tolerances, light-emitting diodes can have unintended slightly different emission spectra and performance. Devices having variations that are consequences of imperfect materials or processes are not considered heterogeneous, different, or operationally different herein, since such variable devices are not intended to operate or function differently but are rather desired to behave identically. As used herein, heterogeneous, different, or operationally different light emitters are intended to behave, function, perform, act, or operate differently. Alternatively or in addition, as used herein heterogeneous, different, or operationally different light emitters are intended to have different purposes, aims, uses, or roles in the display of the present invention. For example, redundant light emitters within pixels for displays are intended to operate identically in place of each other and are therefore not operationally different and are not considered to be heterogeneous or different even though they are separate devices and can be packaged separately and can experience variability due to manufacturing variation. In contrast, a light emitter that takes the place of another light emitter but is designed, desired, and intended to behave differently is operationally different.

According to embodiments of the present invention, the differences in the first and second light emitters 30, 32 within a heterogeneous sub-pixel 22 can include any of the following or a combination thereof:

differences in the hue, tint, or shade of light emitted by the different first and second light emitters 30, 32 in response to a common control signal;

differences in the emission spectrum of the different first and second light emitters 30, 32;

differences in brightness of the different first and second light emitters 30, 32 in response to a common control signal;

differences in size of the different first and second light emitters 30, 32;

differences in size of the light-emissive area 28 of the different first and second light emitters 30, 32;

differences in efficiency of the different first and second light emitters 30, 32;

differences in the electronic properties or response of the different first and second light emitters 30, 32;

differences in the angular distribution of emitted light of the different first and second light emitters 30, 32;

differences in the mechanism by which light is emitted by the different first and second light emitters 30, 32; or differences in the physical structure of the different first and second light emitters 30, 32.

As used herein, a difference in the hue, tint, or shade of light means that the first light emitter 30 emits a different hue, tint, or shade of a color than the second light emitter 32, for example different hues, tints, or shades of a color that are distinguishable by a human observer or by a machine when driven by a common signal. A difference in the hue, tint, or shade of a color of light can mean that the first light emitter 30 emits a different frequency, saturation, or brightness of light than the second light emitter 32. As explicitly intended herein, different hues, tints, or shades of a color of light includes different hues, tints, or shades of red light, different hues, tints, or shades of green light, different hues, tints, or shades of blue light, or different hues, tints, or shades of yellow light. A hue, tint, or shade can be a gradation or variety of a color or primary color such as red, green, blue, or yellow.

As used herein, a difference in emission spectrum means that the first light emitter 30 emits light with a different spectrum than the second light emitter 32. Light with a different spectrum can be a perceptually different color or can be the same color. For example, the color rendering index describes light visible to humans that has the same color but different spectra. Thus, light emitted by the first light emitter 30 can have a different color rendering index than light emitted by the second light emitter 32, but the same, or different color.

As used herein, a difference in size or light-emissive area means that the first light emitter 30 has a different physical size or light emitting area than the second light emitter 32.

As used herein, a difference in brightness means that the first light emitter 30 emits more or fewer photons than the second light emitter 32. The difference in brightness can be an absolute limit in achievable brightness or an absolute limit on the ability to limit brightness (e.g., a lower limit on the black level). The difference in brightness can also be a difference in the photons emitted in response to a common control signal.

As used herein, a difference in efficiency means that the first light emitter 30 emits more or fewer photons than the second light emitter 32 in response to a common control signal or power.

As used herein, a difference in angular distribution of emitted light means that the first light emitter 30 emits light at a wider or narrower range of angles than the second light emitter 32. For example, the first light emitter 30 can emit light with a Lambertian distribution and the second light emitter 32 cannot.

As used herein, a difference in electronic property or response means that the first light emitter 30 functions differently in an electronic circuit than the second light emitter 32. For example, the first light emitter 30 can have a different resistance, capacitance, or breakdown voltage than the second light emitter 32. The first light emitter 30 could be a diode and the second light emitter 32 could not be a diode. Both the first light emitter 30 and the second light emitter 32 could be diodes but with different turn-on voltages, or could be diodes of different types.

As used herein, a difference in physical mechanism for emitting light means that the first light emitter 30 uses a different physical property for emitting light than the second light emitter 32. For example, the first light emitter 30 could be a light-emitting diode and the second light emitter 32 could use optically pumped phosphors, or radiation due to heating.

As used herein, a difference in physical structure means that the first light emitter 30 uses different materials or arrangements of materials for emitting light than the second light emitter 32. For example, the first light emitter 30 could be an inorganic light emitter and the second light emitter 32 could use an organic light emitter. Alternatively, the first light emitter 30 could be a point light emitter and the second light emitter 32 could be a one dimensional (line) or two-dimensional (area) emission, for example a diode, filament, cylinder, or plane segment (e.g., rectangle).

As shown in FIG. 1, the pixels 20 are spatially distributed over the display substrate 12 and each first light emitter 30 of a heterogeneous sub-pixel 22 is adjacent to the corresponding second light emitter 32 of the same heterogeneous sub-pixel 22. By adjacent light emitters is meant that no other light emitter is between the adjacent light emitters. This arrangement has the advantage of reducing the spatial distance between the first and second light emitters 30, 32 in a common heterogeneous sub-pixel 22 so that they are more difficult to distinguish by an observer at a designed viewing distance for the heterogeneous light-emitter display 10, thereby improving perceived color mixing.

Figure 3A:
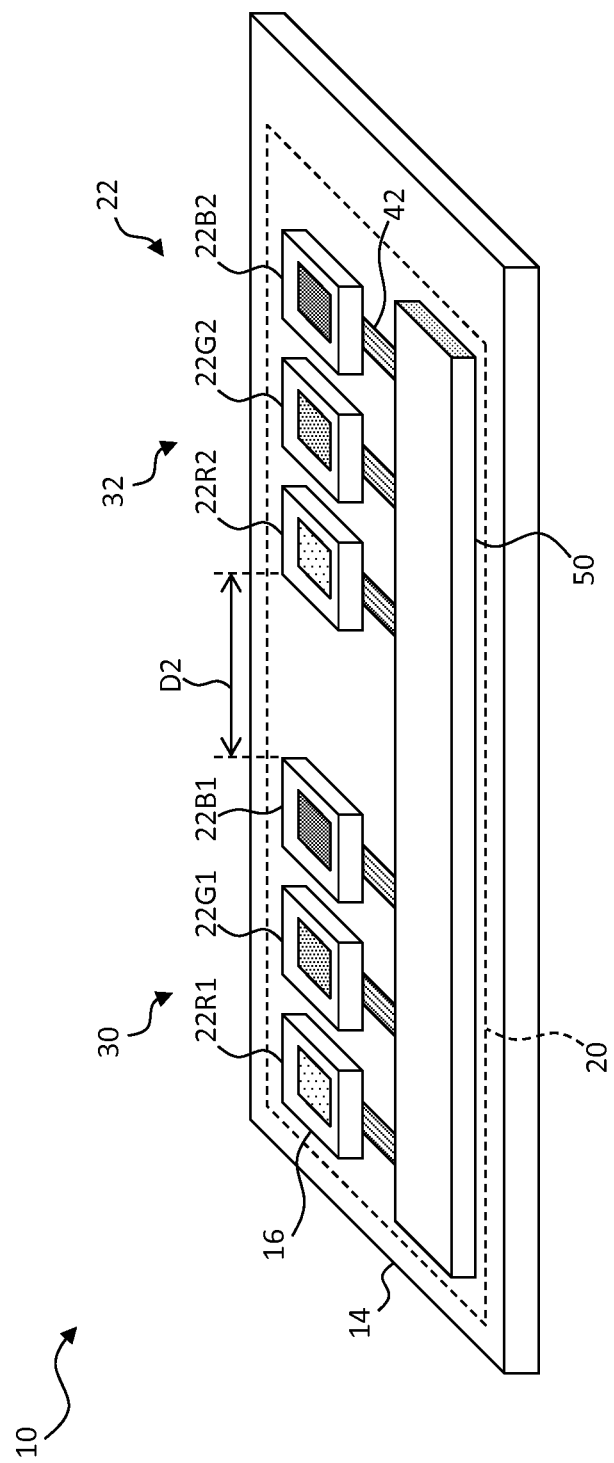
FIGS. 3A and 3B are perspectives of a pixel according to another embodiment of the present invention having a different arrangement of light emitters.

In an alternative embodiment illustrated in the perspective of FIG. 3A, pixels 20 have heterogeneous sub-pixels 22 (in this case red, green, and blue heterogeneous sub-pixels) with first and second light emitters 30, 32 that are not adjacent and are spatially separated by other light emitters, for example by the light emitters of other sub-pixels. As shown in FIG. 3A, for example, the first red light emitter 22R1 is separated from the second red light emitter 22R2 by the first green light emitter 22G1 and the first blue light emitter 22B1. Similarly, the first green light emitter 22G1 is separated from the second green light emitter 22G2 by the first blue light emitter 22B1 and the second red light emitter 22R2 and the first blue light emitter 22B1 is separated from the second blue light emitter 22B2 by the second red light emitter 22R2 and the second green light emitter 22G2. In an embodiment, the first light emitters 30 in a heterogeneous sub-pixel 22 are separated from the second light emitters 32 in the same heterogeneous sub-pixel 22 by a distance D2 that is the same as the inter-pixel distance D1. Thus, the first light emitter 30 can serve as a separate pixel from the second light emitters 32 if they are controlled to emit light corresponding to different image pixels, for example adjacent image pixels in an image.

In the embodiments of FIGS. 1 and 2, the pixel controller 50 (or display controller 40) can control the first and second light emitters 30, 32 to emit light corresponding to the same image pixel so that both the first and second light emitters 30, 32 act to form a single heterogeneous sub-pixel 22. Alternatively, in the embodiment of FIG. 3A, the pixel controller 50 (or display controller 40) can control the first light emitters 30 to emit light corresponding to a first image pixel and the second light emitters 32 to emit light corresponding to a second image pixel different from the first image pixel, for example an adjacent pixel in an image. In this embodiment, each heterogeneous sub-pixel 22 acts to display two different image sub-pixels. The first light emitter 30 in a heterogeneous sub-pixel 22 can display a first image sub-pixel and the second light emitters 32 in the same heterogeneous sub-pixel 22 can display a second image sub-pixel different from the first sub-pixel, for example a spatially adjacent image sub-pixel, thus doubling the spatial resolution of the heterogeneous light-emitter display 10. Of course, the pixel or display controller 50, 40 can control the first and second light emitters 30, 32 of either of the embodiments of FIGS. 1 and 3A as a single image sub-pixel in a lower resolution display or as two adjacent image sub-pixels in a higher resolution display. In the case of FIGS. 1 and 3A, if both the first and second light emitters 30, 32 of a heterogeneous sub-pixel 22 in a pixel 20 are controlled to emit light from the same image sub-pixel, the pixel 20 will have improved color mixing. In an embodiment, the heterogeneous light-emitter display 10 switches between higher and lower resolution depending on the use of the display.

Thus, in the embodiment illustrated in FIG. 3A, the first light emitters 30 can be considered to form a first display pixel and the second light emitters 32 can be considered to form a second display pixel. If the one or more pixel controllers 50 (or display controller 40) control the first and second pixels to emit light in accordance with adjacent image pixels, the heterogeneous light-emitter display 10 is a display for which alternating pixels use the first light emitters 30 and the remaining pixels use the second light emitters 32. Considered in this way, the heterogeneous light-emitter display 10 has only one light emitter per sub-pixel 23, but twice as many pixels 20 and sub-pixels 23 than in the configuration of FIGS. 1 and 2.

Figure 3B:
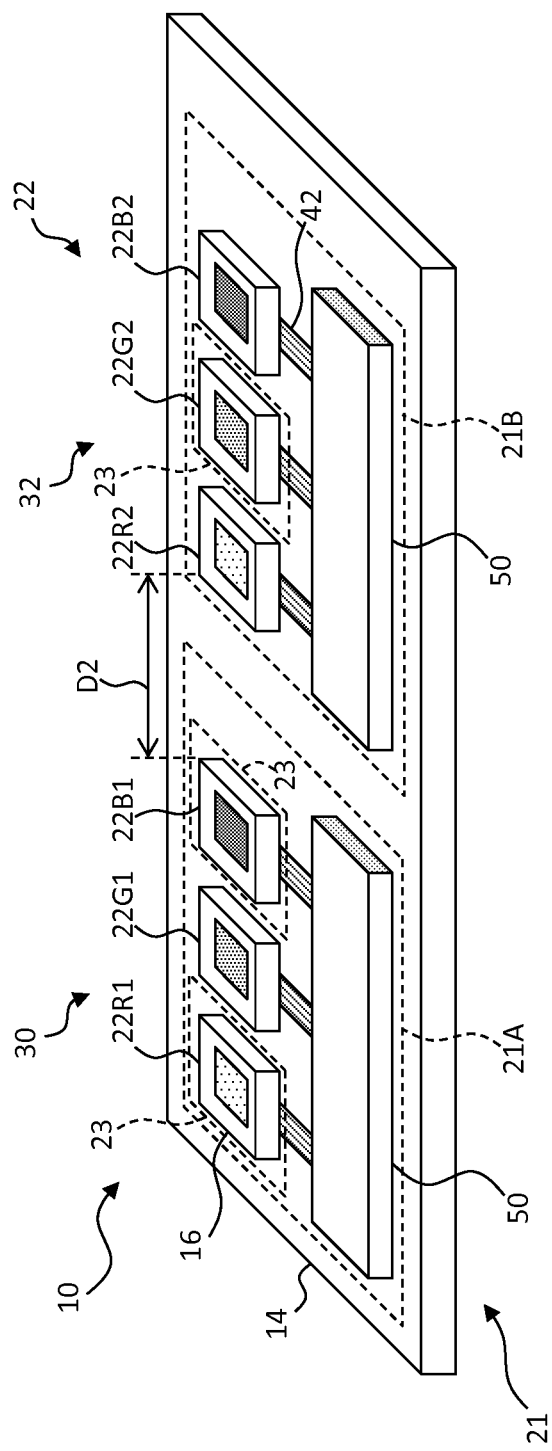

Therefore, in a further embodiment of the present invention and as shown in FIG. 3B, the heterogeneous light-emitter display 10 includes a display substrate 12 having an array of heterogeneous double pixels 21 disposed thereon. The heterogeneous double pixels 21 include a first pixel 21A and a second pixel 21B that are different in the same ways as described above with respect to the different first and second light emitters 30, 32 in the heterogeneous sub-pixels 22. Each first and second pixel 21A, 21B includes at least first and second sub-pixels 23 that emit corresponding first and second different colors of light. The first sub-pixel 23 of each of the first pixels 21A includes a first light emitter 30 and the first sub-pixel 23 of each of the second pixels 21B includes a second light emitter 32 different from the first light emitter 30. A pixel controller 50 controls the heterogeneous double pixels 21, the first and second pixels 21A, 21B, the first and second sub-pixels 23, and the first and second light emitters 30, 32. In one embodiment a single display controller 40 is a pixel controller 50 that controls all of the pixel and light emitters (FIG. 1). In another embodiment, an individual pixel controller 50 controls each first and second pixel 21A, 21B in the heterogeneous double pixels 21 (as shown in FIG. 3B). In an alternative embodiment, a pixel controller 50 controls each pixel 20 (as in FIG. 3A).

The pixels of the heterogeneous light-emitter display 10 illustrated in FIGS. 3A and 3B are essentially equivalent; only the control structure or part labeling varies. The embodiment of FIG. 3A is labeled as a single display pixel that displays two image pixels, one image pixel displayed with the first light emitters 30 and the other image pixel displayed with the second light emitters 32. The embodiment of FIG. 3B is labeled as a heterogeneous pair of first and second pixels 21A, 21B that each displays one image pixel, the first pixel 21A using the first light emitters 30 to display the first image pixel and the second pixel 21B using the second light emitters 32 to display the second image pixel. The arrangements of FIGS. 3A and 3B are functionally equivalent and the differences are merely a matter of semantics except that a single pixel controller 50 is shown in FIG. 3A and two pixel controllers 50 are shown in FIG. 3B.

Figure 6:
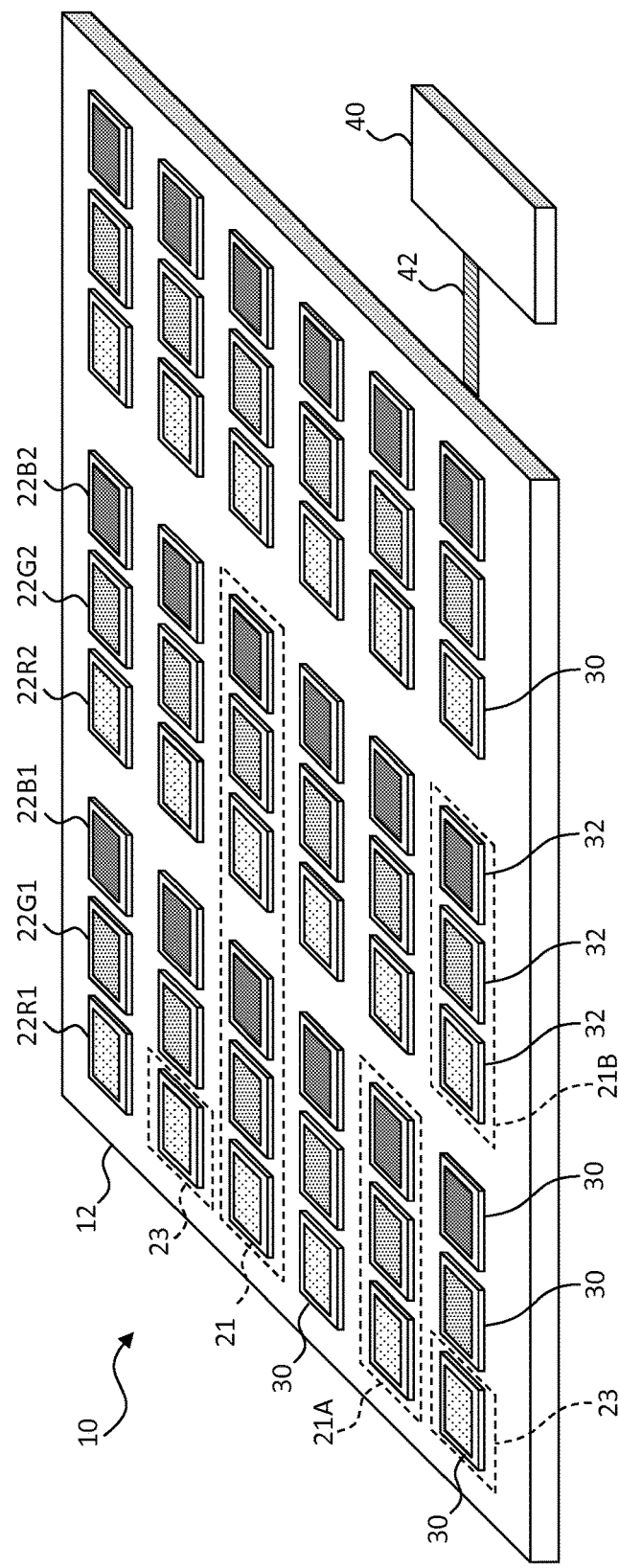
FIG. 6 is a perspective of another embodiment of the present invention.

Referring to FIG. 6, the heterogeneous light-emitter display 10 of FIG. 1 is illustrated using labeling corresponding to FIG. 3B and slightly different spacing for the first and second light emitters 30, 32 over the display substrate 12. Heterogeneous double pixels 21 include spatially adjacent first and second pixels 21A, 21B each having multiple sub-pixels 23 that each emit different colors. The sub-pixels 23 corresponding to the first pixel 21A include the first light emitters 30 and the sub-pixels 23 corresponding to the second pixel 21B include the second light emitters 32.

As shown in FIG. 1, in an embodiment of the present invention one or both of the first light emitters 30 and the second light emitters 32 has a light-emitter substrate 16 separate and distinct from the display substrate 12. Moreover, the first light emitter 30 and the second light emitter 32 can each have a separate and distinct light-emitter substrate 16. As shown in FIG. 3, the first light emitter 30 and the second light emitter 32 can be disposed on a common pixel substrate 14 and the pixel substrate 14 is disposed on the display substrate 12 (not shown). The first light emitter 30 and the second light emitter 32 can be formed in the pixel substrate 14 or, as shown in FIG. 3, the first light emitter 30 and the second light emitter 32 can each have a separate and distinct light-emitter substrate 16 that is separate and distinct from both the pixel substrate 14 and the display substrate 12. As shown in FIGS. 1-6, the pixel controller 50 can also have a substrate separate and distinct from the light-emitter substrates 16, the pixel substrate 14, and the display substrate 12.

Figures 4, 5:
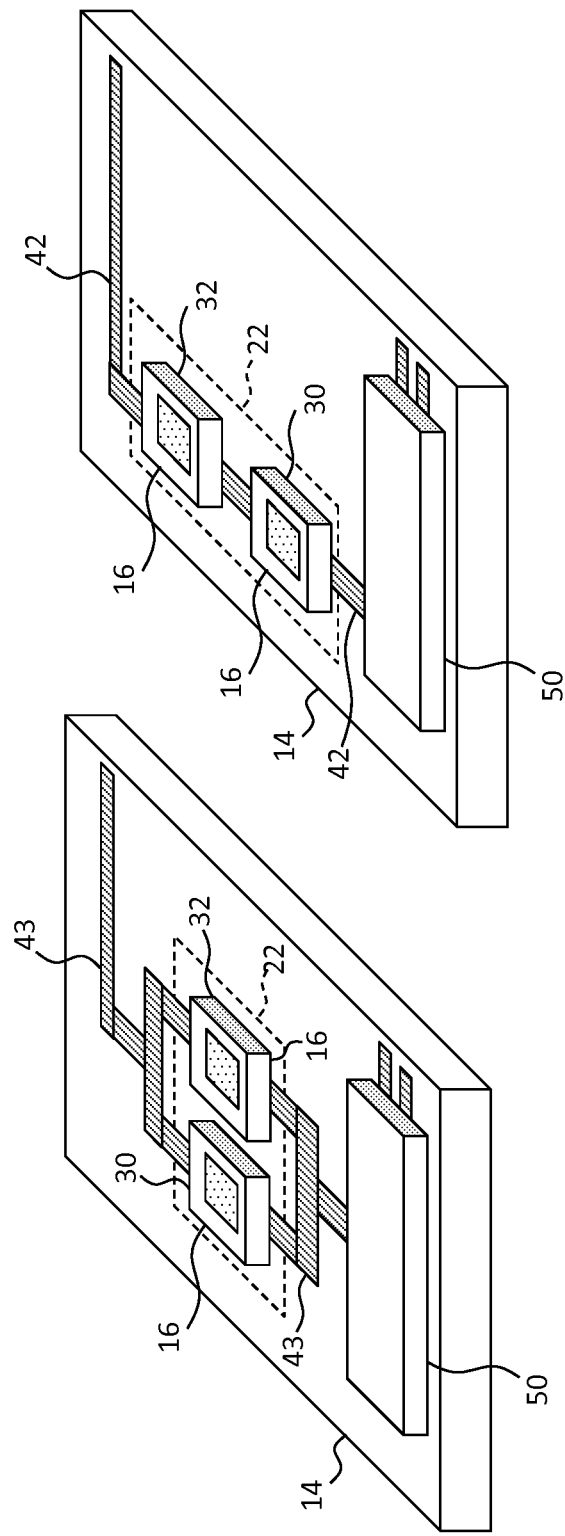
FIGS. 4 and 5 are alternative electrical arrangements of heterogeneous light emitters in a sub-pixel according to alternative embodiments of the present invention.

As shown in FIGS. 2, 3A, and 3B, the pixels 20 are separately controlled by the pixel controller 50 through separate wires 42 or buses that conduct control signals to the various light emitters of the pixels 20. (For clarity, display substrate wiring is not shown in FIGS. 1 and 6.) Referring next to FIG. 4, in an embodiment the first and second light emitters 30, 32 are controlled in parallel through common input wires 43 or a bus. In this arrangement, both the first and second light emitters 30, 32 of a heterogeneous sub-pixel 22 receive the same control, power, or ground signals, for example from the pixel controller 50. Thus the second light emitter 32 can serve as a redundant, but different, light emitter for the first light emitter 30 (or vice versa). In an alternative embodiment shown in FIG. 5, the first and second light emitters 30, 32 are controlled in series with input wires 42 or a bus. In this arrangement, the first light emitter 30 of a heterogeneous sub-pixel 22 receives control, power, or ground signals, for example from the pixel controller 50, and the second light emitter 32 of the heterogeneous sub-pixel 22 receives control, power, or ground signals from the first light emitter 30 of the heterogeneous sub-pixel 22. In this arrangement, signals can be propagated from the first light-emitter 30 to the second light-emitter 32, possibly simplifying any control circuitry associated with or formed in the first and second light emitters 30, 32. The first or second light-emitters 30, 32 can include communication, processing, or driver circuitry.

In one embodiment of the present invention, the first light emitter 30 or the second light emitter 32 is an inorganic light emitter, an organic light emitter, an inorganic light-emitting diode, an organic light-emitting diode, a laser, a vertical cavity surface emission laser, or an optically pumped or electrically controlled phosphor, nano-crystal, or quantum dot.

In another embodiment, the first light emitter 30 is an inorganic light-emitter and the second light emitter 32 is an organic light-emitter. In further embodiments, the first light emitter 30 is an inorganic light-emitting diode and the second light emitter is an organic light-emitting diode or both the first light emitter 30 and the second light emitter 32 is an inorganic light-emitting diode. In an alternative embodiment, the first light emitter 30 is a relatively small inorganic light-emitting diode and the second light emitter 32 is a relatively large inorganic light-emitting diode. In yet another embodiment, the first light emitter 30 is a laser and the second light emitter 32 is an inorganic light-emitting diode.

The present invention has application to a wide variety of display types and viewing situations and can overcome limitations in prior-art displays, for example performance limitations.

In one embodiment of the present invention, the first light emitter 30 has a narrower angular distribution of emitted light than the second light emitter 32. For example, the first light emitter 30 could be a laser with a very narrow angular distribution of emitted light and the second light emitter 32 could be an inorganic light-emitting diode (LED) having a nearly Lambertian distribution of emitted light. In one operational mode, the control circuit 52 of the pixel controller 50 controls both the first and second light emitters 30, 32 to simultaneously emit light. However, at a non-orthogonal viewing angle, light from the first light emitter 30 (the laser) is wasted. At an orthogonal viewing angle light from the second light emitter 32 (the LED) is largely wasted. Thus, this operational mode is relatively inefficient. Alternatively, when a relatively wide viewing angle for the display is desired, for example with a digital camera used indoors or under relatively low outdoor illumination, the control circuit 52 of the pixel controller 50 operates the second light emitter 32 LED to emit light and turns off the first light emitter 30 laser. Under relatively high outdoor illumination (e.g., a bright sunny day), human camera operators typically hold the camera display close and perpendicular to their eye and shade the display to protect the display from the ambient illumination. In this case, the control circuit 52 of the pixel controller 50 turns on the first light emitter 30 laser and turns off the second light emitter 32 LED. Almost all of the first light emitter 30 laser is transmitted to the user's eye, greatly improving the contrast of the display without a corresponding increase in power used. Thus, the present invention provides improved utility and reduced power usage for such a display.

In another embodiment of the present invention, the first light emitter 30 is a relatively smaller light-emitting diode than the second light emitter 32, for example in a mobile electronic device having a display of the present invention. Smaller light-emitting diodes are typically more efficient but have a reduced maximum brightness compared to relatively larger light-emitting diodes that can emit more light but are less efficient. When ambient light is relatively low, for example indoors, the control circuit 52 of the pixel controller 50 turns on the first light emitter 30 and turns off the second light emitter 32, providing a very efficient display operational mode that preserves the battery life of the mobile device. When ambient light is relatively high, for example outdoors, the control circuit 52 of the pixel controller 50 also turns on the second light emitter 32, providing a very bright display device. Therefore, in such an embodiment the pixel controller 50 controls the first light emitter 30 to emit light corresponding to a first brightness and the second light emitter 32 to emit light corresponding to a second brightness different from the first brightness.

In an alternative embodiment of the present invention, the first light emitter 30 is light-emitting diode that emits a different hue, tint, or shade of a color or has a different spectrum than the second light emitter 32. Because of variations in materials and manufacturing processes, collections of light-emitting diodes emit light of slightly different hues of a given color, particularly if the light-emitting diodes are made in different wafer lots. In consequence, a perceptible variation in a color, for example red, green, or blue, over an area of a display can be visible to a display observer. By purposely selecting light-emitting diodes that emit slightly different hues of a common color for the first and second light emitters 30, 32 in a heterogeneous sub-pixel 22, the variation in the perceived color is reduced. Furthermore, the color rendering index of the display device when display a white color is improved because the net breadth of the emitted spectrum is increased. Since displays (e.g., mobile phone displays) are sometimes also used for illumination, such an improvement in the color rendering index is useful. In such embodiments, the first and second light emitters 30, 32 of the heterogeneous sub-pixels 22 of the plurality of pixels 20 have corresponding first and second distributions of light emission frequencies and the combination of the first and second distributions is less variable than the each of the first and second distributions alone.

In another embodiment of the present invention, the first and second light emitters 30, 32 mutually compensate for variations in performance. For example, a first light emitter tends to emit light that is increasingly red as the brightness of the light emitter increase. At the same time, a second light tends to emit light that is increasingly orange as the brightness of the light emitter increase. The effect for a viewer is that the perceived color of emitted light from the combined first and second light emitters 30, 32 changes less than the color of the individual light emitters, thus maintaining color stability in the emitted light as the light changes in brightness.

In all of these cases, the first light emitter 30 can be differently controlled from the second light emitter 32, for example one light emitter is off when the other is on, or one light emitter is at 90% utilization while the other is at 10%. In another embodiment, both the first and the second light emitters 30, 32 are controlled the same by the control circuit 52 in the pixel controller 50 or with the same control signals, for example both first and second light emitters 30, 32 are turned off, both are turned on at maximum utilization, or both are controlled at 50% utilization.

In all of these cases, the operational difference between the first and second light emitters 30, 32 can vary depending on, or in response to, the control signals or power supplied to the first and second light emitters 30, 32, even if the first and second light emitters 30, 32 are controlled by the same control signals or power signals (e.g., voltage or frequency).

In an embodiment, the display substrate 12 includes a contiguous display area 18 that includes the plurality of pixels 20, 21. The light emitters (e.g., first and second light emitters 30, 32) each have a light-emissive area 28. The combined light-emissive areas 28 of the plurality of light emitters is less than or equal to one-quarter of the contiguous display area 18. For example, the combined light-emissive areas 28 of the plurality of light emitters is less than or equal to one eighth, one tenth, one twentieth, one fiftieth, one hundredth, one five-hundredth, one thousandth, one two-thousandth, or one ten-thousandth of the contiguous display area 18. In such an embodiment, the fill factor of the display is relatively low and the remaining substrate area can be used, for example to provide sensors that provide information to the display controller 40 or the pixel controller(s) 50.

Multiple light emitters used to provide illumination, for example LEDs sometimes employ a variety of different light emitters to provide a broad spectrum of emitted light with a good color rendering index. However, such illuminators provide white light that cannot be used for a display because displays require highly saturated colored light to display images that is contrary to the needs of general illumination. Moreover, the light emitters are not independently controlled, for example as is necessary to display information or images.

In operation, the pixel controller(s) 50 provide signals to the first and second light emitters 30, 32 causing them to emit light. The signals can vary depending on the location of the first and second light emitters 30, 32 over the display area 18 (FIG. 1) so that the pixels 20, 21 can display images. Moreover, the signals provided to the first light emitters 30 can be different from the signals provided to the second light emitters 32 so that they emit different amounts of light, for example in response to ambient light present on the display, viewer behavior, or choice of display use.

The display controller 40, pixel controllers 50, and first and second light emitters 30, 32 can be made in one or more integrated circuits having separate, independent, and distinct substrates, for example light-emitter substrates 16. For example, the pixel controllers 50 and first and second light emitters 30, 32 can be chiplets, small, unpackaged integrated circuits such as unpackaged dies interconnected with wires connected to contact pads on the chiplets. The chiplets can be disposed on an independent light-emitter substrate, such as a pixel substrate 14 or a display substrate 12. If the chiplets are disposed on pixel substrates 14, the pixel substrates 14 can be disposed on the display substrate 12. In an embodiment, the chiplets are made in or on a semiconductor wafer and have a semiconductor substrate and the display substrate 12 is or includes glass, resin, polymer, plastic, or metal. The pixel substrates 14 can be made in semiconductor materials or in glass, resin, polymer, plastic, or metal. A variety of semiconductor materials (for example silicon or GaN) and processes for making small integrated circuits can be used. Likewise, a variety of display substrates 12 (backplane substrates) and architectures/methods for interconnecting integrated circuit elements on the display substrate 12 can be used. The chiplets can be applied to the pixel substrates 14 or to the display substrate 12 using micro transfer printing. The pixel substrates 14 can be applied to the display substrate 12 using micro transfer printing.

The multiple first and second light emitters 30, 32 can have common substrate materials or a variety of different substrate materials including silicon and GaN. In an embodiment, one of the integrated circuits (for example having a silicon semiconductor substrate) is a pixel controller 50 and can include a computing element and another of the integrated circuits (for example having a GaN semiconductor substrate) is a first or second light emitter 30, 32, for example an inorganic LED.

Each of the first and second light emitters 30, 32 can have a separate, independent, and distinct light-emitter substrate 16 and the different first and second light emitters 30, 32 emitting different colors of light can have different substrate materials, for example different semiconductor materials or differently doped semiconductor materials. The first and second light emitters 30, 32 can form full-color red, green, and blue pixels 20 or heterogeneous double pixels 21 in a heterogeneous light-emitter display 10.

Each of these first and second light emitters 30, 32 or pixel controllers 50 can have a substrate separate, independent and distinct from the display substrate 12 and can be disposed directly on the display substrate 12, for example by micro transfer printing. In an alternative embodiment, the first and second light emitters 30, 32 or pixel controllers 50 are disposed on pixel substrates 14, for example by micro transfer printing. The pixel substrates 14 are disposed on the display substrate 12 and are smaller than, separate, and distinct from the display substrate 12. The pixel substrates 14 can, for example, be similar to the display substrate 12 (e.g. made of or including glass, resin, metal, or plastic) but in a much smaller size, for example having an area of 50 square microns, 100 square microns, 500 square microns, or 1 square mm and can be only a few microns thick, for example 5 microns, 10 microns, 20 microns, or 50 microns thick.

In one method of the present invention the pixel substrates 14 are disposed on the display substrate 12 by micro transfer printing using compound micro assembly structures and methods, for example as described in U.S. patent application Ser. No. 14/822,868 filed Aug. 10, 2015, entitled Compound Micro-Assembly Strategies and Devices, which is hereby incorporated by reference in its entirety. However, since the pixel substrates 14 are larger than the chiplets, in another method of the present invention, the pixel substrates 14 are disposed on the display substrate 12 using pick-and-place methods found in the printed-circuit board industry, for example using vacuum grippers. The first and second light emitters 30, 32 or pixel controllers 50 in the pixel substrates 14 can be interconnected using photolithographic methods and materials or in the display substrate 12 using printed circuit board methods and materials. The interconnections are shown in FIGS. 1 and 2, but for clarity are omitted from FIGS. 1 and 6.

In useful embodiments the display substrate 12 includes material, for example glass or plastic, different from a material in an integrated-circuit or chiplet substrate, for example a semiconductor material such as silicon or GaN. The first or second light emitters 30, 32 can be formed separately on separate semiconductor substrates, assembled onto the pixel substrates 14, and then the assembled unit is disposed on the surface of the display substrate 12. This arrangement has the advantage that the first and second light emitters 30, 32 can be separately tested on the pixel substrates 14 and the pixel substrate 14 accepted, repaired, or discarded before it is located on the display substrate 12, thus improving yields and reducing costs.

The first or second light emitters 30, 32 are electrically connected to one or more electrically conductive wires 42 that electrically connect the first or second light emitters 30, 32 and the pixel controllers 50 or display controllers 40 to conduct power, a ground reference voltage, or signals for controlling the first or second light emitters 30, 32. In an embodiment, the conductive wires 42 are connected to a display controller 40 that is external to the display substrate 12. In an alternative embodiment, not shown, the display controller 40 is located on the display substrate 12 outside the display area 18. If individual pixel controllers 50 are used, they can be spatially distributed over the display substrate 12 in spatial correspondence to the pixels 20 or heterogeneous double pixels 21 on the display substrate 12 or on pixel substrates 14 that are spatially distributed over the display substrate 12. The display controller 40 controls the first or second light emitters 30, 32 or pixel controllers 50 by, for example, providing power, a ground reference signal, and control signals.

In an embodiment, the first and second light emitters 30, 32 (e.g. micro-LEDs) are transfer printed to the pixel substrates 14 or the display substrate 12 in one or more transfers. For a discussion of micro-transfer printing techniques see, U.S. Pat. Nos. 8,722,458, 7,622,367 and 8,506,867, each of which is hereby incorporated by reference. The transferred first or second light emitters 30, 32 are then interconnected, for example with conductive wires and optionally including connection pads and other electrical connection structures, to enable the display controller 40 or pixel controllers 50 to electrically interact with the first or second light emitters 30, 32 to emit light in the heterogeneous light-emitter display 10 of the present invention. In an alternative process, the transfer of the first or second light emitters 30, 32 is performed before or after all of the conductive wires are in place. Thus, in embodiments the construction of the conductive wires can be performed before the first or second light emitters 30, 32 are printed, or after the first or second light emitters 30, 32 are printed, or both. In an embodiment, the display controller 40 is externally located (for example on a separate printed circuit board substrate) and electrically connected to the conductive wires using connectors, ribbon cables, or the like. Alternatively, the display controller 40 is affixed to the display substrate 12 outside the display area 18 and electrically connected to the conductive wires using wires and buses, for example using surface mount and soldering technology.

In an embodiment of the present invention, an array of first and second light emitters 30, 32 (e.g., as in FIG. 1 or 6) can include 40,000, 62,500, 100,000, 500,000, one million, two million, three million, six million or more first and second light emitters 30, 32 for example for a quarter VGA, VGA, or HD display having various resolutions. In an embodiment of the present invention, the first or second light emitters 30, 32 can be considered integrated circuits, since they are formed in a substrate using integrated-circuit processes.

According to various embodiments of the present invention, the heterogeneous light-emitter display 10 can include a display substrate 10 on which the array of first and second light emitters 30, 32 are disposed. The display substrate 12 usefully has two opposing smooth sides suitable for material deposition, photolithographic processing, or micro-transfer printing of micro-LEDs. The display substrate 12 can have the size of a conventional display, for example a rectangle with a diagonal of a few centimeters to one or more meters. Such substrates are commercially available. The display substrate 12 can include polymer, plastic, resin, polyimide, PEN, PET, metal, metal foil, glass, a semiconductor, or sapphire and have a transparency greater than or equal to 50%, 80%, 90%, or 95% for visible light. In some embodiments of the present invention, the first and second light emitters 30, 32 emit light through the display substrate 12. In other embodiments, the first and second light emitters 30, 32 emit light in a direction opposite the display substrate 12. The display substrate 12 can have a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm. According to embodiments of the present invention, the display substrate 12 can include layers formed on an underlying structure or substrate, for example a rigid or flexible glass or plastic substrate.

In an embodiment, the display substrate 12 can have a single, connected, contiguous display area 18 that includes the first and second light emitters 30, 32 and the first and second light emitters 30, 32 each have a light-emissive area 28. The combined light-emissive areas 28 of the plurality of first and second light emitters 30, 32 is less than or equal to one-quarter of the contiguous display area 18. In further embodiments, the combined light-emissive areas 28 of the plurality of first and second light emitters 30, 32 is less than or equal to one eighth, one tenth, one twentieth, one fiftieth, one hundredth, one five-hundredth, one thousandth, one two-thousandth, or one ten-thousandth of the contiguous display area 18. The light-emissive area 28 of the first and second light emitters 30, 32 can be only a portion of the first and second light emitters 30, 32. In a typical light-emitting diode, for example, not all of the semiconductor material in the light-emitting diode necessarily emits light. Therefore, in another embodiment, the first and second light emitters 30, 32 occupy less than one quarter of the display area 18.

In an embodiment of the present invention, the first and second light emitters 30, 32 are micro-light-emitting diodes (micro-LEDs), for example having light-emissive areas 28 of less than 10, 20, 50, or 100 square microns. In other embodiments, the first and second light emitters 30, 32 have physical dimensions that are less than 100 µm, for example having a width from 2 to 5 µm, 5 to 10 µm, 10 to 20 µm, or 20 to 50 µm, having a length from 2 to 5 µm, 5 to 10 µm, 10 to 20 µm, or 20 to 50 µm, or having a height from 2 to 5 µm, 4 to 10 µm, 10 to 20 µm, or 20 to 50 µm. The first and second light emitters 30, 32 can have a size of one square micron to 500 square microns. Such micro-LEDs have the advantage of a small light-emissive area 28 compared to their brightness as well as color purity providing highly saturated display colors and a substantially Lambertian emission providing a wide viewing angle.

According to various embodiments, the heterogeneous light-emitter display 10 of the present invention, includes a variety of designs having a variety of resolutions, first and second light emitter 30, 32 sizes, and displays having a range of display areas 18. For example, display areas 18 ranging from 1 cm by 1 cm to 10 m by 10 m in size are contemplated. In general, larger first and second light emitters 30, 32 are most useful, but are not limited to, larger display areas 18. The resolution of first and second light emitters 30, 32 over a display area 18 can also vary, for example from 50 light emitters per inch to hundreds of light emitters per inch, or even thousands of light emitters per inch. For example, a three-color display can have one thousand 10µ×10µ light emitters per inch (on a 25-micron pitch). Thus, the present invention has application in both low-resolution and very high-resolution displays and from very small to very large displays. An approximately one-inch 128-by-128 pixel display having 3.5 micron by 10-micron emitters has been constructed and successfully operated without redundant emitters as described in U.S. patent application Ser. No. 14/743,981 filed Jun. 18, 2015, entitled Micro-Assembled Micro LED Displays and Lighting Elements, which is hereby incorporated by reference in its entirety.

As shown in FIGS. 1 and 6, the full-color pixels 20 or heterogeneous double pixels 21 form a regular array on the display substrate 12. Alternatively, at least some of the full-color pixels 20 or heterogeneous double pixels 21 have an irregular arrangement on the display substrate 12.

In an embodiment, the integrated circuits or chiplets are formed in substrates or on supports separate from the display substrate 12. For example, the first or second light emitters 30, 32 are separately formed in a semiconductor wafer. The first or second light emitters 30, 32 are then removed from the wafer and transferred, for example using micro transfer printing, to the display substrate 12 or pixel substrate 14. This arrangement has the advantage of using a crystalline semiconductor substrate that provides higher-performance integrated circuit components than can be made in the amorphous or polysilicon semiconductor available on a large substrate such as the display substrate 12.

By employing a multi-step transfer or assembly process, increased yields are achieved and thus reduced costs for the heterogeneous light-emitter display 10 of the present invention. Additional details useful in understanding and performing aspects of the present invention are described in U.S. patent application Ser. No. 14/743,981 filed Jun. 18, 2015, entitled Micro Assembled Micro LED Displays and Lighting Elements.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

D1 distance
D2 distance
10 heterogeneous light-emitter display
12 display substrate
14 pixel substrate
16 light-emitter substrate
18 display area
20 pixel
21 heterogeneous double pixel
21A first pixel
21B second pixel
22 heterogeneous multi-component sub-pixel
22R red sub-pixel
22G green sub-pixel
22B blue sub-pixel
22R1 first red light emitter
22R2 second red light emitter
22G1 first green light emitter
22G2 second green light emitter
22B1 first blue light emitter
22B2 second blue light emitter
23 sub-pixel
28 light-emissive area
30 first light emitter
32 second light emitter
40 display controller
42 wires/bus
43 common input wires/bus
50 pixel controller
52 control circuit

What is claimed:

1. A heterogeneous light-emitter display, comprising:
a display substrate having a plurality of pixels disposed thereon, each pixel comprising at least a first heterogeneous multiple-component sub-pixel emitting a first color of light and a second sub-pixel emitting a second color of light different from the first color; and
one or more pixel controllers for controlling the pixels and the first and second sub-pixels,
wherein the display is operable to simultaneously emit light from each light emitter in the first heterogeneous multiple-component sub-pixel, and
wherein the first heterogeneous multiple-component sub-pixel comprises a first light emitter and a second light emitter, and the first light emitter and the second light emitter emit light that has corresponding differences in a light-emission attribute, and wherein the combination of the light emitted from the first light emitter and the second light emitter is less variable with respect to the light-emission attribute than the light emitted individually from each of the first light emitter and the second light emitter, thereby mutually compensating for the differences in the light-emission attribute.

2. The display of claim 1, wherein each pixel comprises a red sub-pixel that emits red light, a green sub-pixel that emits green light, and a blue sub-pixel that emits blue light.

3. The display of claim 1, wherein the first heterogeneous multiple-component sub-pixel comprises a first light emitter and a second light emitter different from the first light emitter.

4. The display of claim 3, wherein the first light emitter emits a different hue, tint, or shade of a color of light than the second light emitter in response to a common control signal.

5. The display of claim 3, wherein the first light emitter emits a different spectrum of light than the second light emitter.

6. The display of claim 3, wherein the first light emitter has a different size than the second light emitter.

7. The display of claim 3, wherein the first light emitter emits a different brightness than the second light emitter in response to a common control signal.

8. The display of claim 3, wherein the first light emitter has a different efficiency than the second light emitter.

9. The display of claim 3, wherein the first light emitter has a different angular distribution of emitted light than the second light emitter.

10. The display of claim 3, wherein:
the first light emitter emits a different hue, tint, or shade of a color of light than the second light emitter in response to a common control signal,
the first light emitter emits a different spectrum of light than the second light emitter,
the first light emitter has a different size than the second light emitter,
the first light emitter emits a different brightness than the second light emitter in response to a common control signal,
the first light emitter has a different efficiency than the second light emitter,
the first light emitter has a different angular distribution of emitted light than the second light emitter,
the first light emitter has a different electronic property or response than the second light emitter,
the first light emitter emits light using a different physical mechanism than the second light emitter, or
the first light emitter has a different physical structure than the second light emitter.

11. The display of claim 1, comprising a third sub-pixel that emits light of a third color of light different from the first color and different from the second color.

12. The display of claim 11, wherein the third sub-pixel is a heterogeneous sub-pixel.

13. The display of claim 1, wherein the first light emitter is a relatively smaller light-emitting diode and the second light emitter is relatively larger light-emitting diode.

14. The display of claim 1, wherein the one or more pixel controllers comprises a control circuit that controls the first light emitter to emit light corresponding to a first brightness and the second light emitter to emit light corresponding to a second brightness different from the first brightness.

15. The display of claim 1, wherein the one or more pixel controllers comprises a control circuit that controls the first light emitter to emit light corresponding to a first image pixel and the second light emitter to emit light corresponding to a second image pixel different from the first image pixel.

16. The display of claim 1, wherein the one or more pixel controllers control the first and second light emitters to emit light corresponding to the same image pixel.

17. The display of claim 1, wherein the pixels are spatially distributed and wherein the first and second light emitters in a sub-pixel are adjacent.

18. The display of claim 1, wherein the second sub-pixel comprises one or more light emitters, wherein the pixels are spatially distributed, and wherein the first and second light emitters in the first sub-pixel are spatially separated by the one or more light emitters of the second sub-pixel.

19. The heterogeneous light-emitter display of claim 1, wherein each of the pixels is disposed on an independent pixel substrate that is disposed on the display substrate.

20. The heterogeneous light-emitter display of claim 1, wherein the at least a first heterogeneous multiple-component sub-pixel comprises an organic light emitter and an inorganic light emitter.

21. A heterogeneous light-emitter display, comprising:
a display substrate having an array of heterogeneous double pixels disposed thereon, each pixel of the double pixel comprising at least first and second sub-pixels that emit corresponding first and second different colors of light;
the heterogeneous double pixels comprising a plurality of first pixels and a plurality of second pixels, the first sub-pixel of each of the first pixels comprising a first light emitter and the first sub-pixel of each of the second pixels comprising a second light emitter different from the first light emitter; and
one or more pixel controllers for controlling the pixels, the first and second pixels, the first and second sub-pixels, and the first and second light emitters,
wherein the first light emitter and the second light emitter are heterogeneous and the display is operable to simultaneously emit light from the first light emitter and the second light emitter, and
wherein the first light emitter and the second light emitter emit light that has corresponding differences in a light-emission attribute, and wherein the combination of the light emitted from the first light emitter and the second light emitter is less variable with respect to the light-emission attribute than the light emitted individually from each of the first light emitter and the second light emitter, thereby mutually compensating for the differences in the light-emission attribute.

22. The heterogeneous light-emitter display of claim 21, wherein the second sub-pixel of each of the first pixels comprises a first light emitter and the second sub-pixel of each of the second pixels comprises a second light emitter different from the first light emitter, or wherein the third sub-pixel of each of the first pixels comprises a first light emitter and the third sub-pixel of each of the second pixels comprises a second light emitter different from the first light emitter, or both.

23. A heterogeneous light-emitter display, comprising:
a display substrate having a plurality of pixels disposed thereon, each pixel comprising at least a first heterogeneous multiple-component sub-pixel emitting a first color of light and a second sub-pixel emitting a second color of light different from the first color; and
one or more pixel controllers for controlling the pixels, wherein first and second light emitters of the heterogeneous sub-pixels of the plurality of pixels have corresponding first and second distributions of light emission frequencies, and wherein the combination of the first and second distributions is less variable than the each of the first and second distributions.

* * * * *